United States Patent
Won et al.

(10) Patent No.: US 7,492,654 B2
(45) Date of Patent: Feb. 17, 2009

(54) MEMORY DEVICE FOR RETAINING DATA DURING POWER-DOWN MODE AND METHOD OF OPERATING THE SAME

(75) Inventors: Myung-Gyoo Won, Gyeonggi-do (KR); Bu-Il Jung, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 320 days.

(21) Appl. No.: 11/423,673

(22) Filed: Jun. 12, 2006

(65) Prior Publication Data

US 2006/0291311 A1    Dec. 28, 2006

(30) Foreign Application Priority Data

Jun. 10, 2005   (KR)   ............ 10-2005-0049712

(51) Int. Cl.
*G11C 7/00*    (2006.01)
(52) U.S. Cl. ............... 365/205; 365/189.09; 365/207
(58) Field of Classification Search ......... 365/205, 365/189.09, 207
See application file for complete search history.

(56) References Cited

U.S. PATENT DOCUMENTS

| | | | |
|---|---|---|---|
| 5,875,143 A | 2/1999 | Ben-Zvi | |
| 5,903,507 A | 5/1999 | Arimoto | |
| 6,097,658 A | 8/2000 | Satoh et al. | |
| 6,167,484 A | 12/2000 | Boyer et al. | |
| 6,928,016 B2* | 8/2005 | Nam et al. | 365/222 |
| 7,110,294 B2* | 9/2006 | Kawai | 365/185.09 |
| 7,193,896 B2* | 3/2007 | Shiga | 365/185.09 |

FOREIGN PATENT DOCUMENTS

| | | |
|---|---|---|
| JP | 2002-260383 | 9/2002 |
| JP | 2005-038502 | 2/2005 |
| KR | 2001-0008981 | 2/2001 |
| TW | 428301 | 4/2001 |
| TW | 446945 | 7/2001 |

OTHER PUBLICATIONS

English language abstract of Korean Publication No. 2001-0008981.
English language abstract of Japanese Publication No. 2002-260383.
English language abstract of Japanese Publication No. 2005-038502.

* cited by examiner

*Primary Examiner*—Tuan T. Nguyen
(74) *Attorney, Agent, or Firm*—Marger Johnson & McCollom, P.C.

(57) ABSTRACT

A memory device includes a bit line sense amplifier, a command decoder configured to generate an internal control signal indicating an operating mode of the memory device, and a bit line sense amplifier controller configured to selectively apply an external voltage as a supply voltage to the bit line sense amplifier in response to the internal control signal.

15 Claims, 6 Drawing Sheets

MEMORY DEVICE FOR RETAINING DATA DURING POWER-DOWN MODE AND METHOD OF OPERATING THE SAME

CROSS-REFERENCE TO RELATED PATENT APPLICATIONS

This application claims the priority of Korean Patent Application No. 10-2005-0049712, filed on Jun. 10, 2005, in the Korean Intellectual Property Office, the disclosure of which is incorporated herein in its entirety by reference.

BACKGROUND

1. Field of the Invention

This disclosure relates to a semiconductor memory device and a method of operating the same, and more particularly, to a memory device capable of retaining data when an internal voltage generator does not operate, and a method of operating the same.

2. Description of the Related Art

There is a growing need for low-power memories in mobile devices, such as personal digital assistants (PDA) and notebook computers. Such devices are being used ever more widely. To satisfy the need, a method of reducing power consumption by adjusting a refresh cycle based on how the length of time data is retained in a memory cell changes according to temperature, and a low-power dynamic random access memory (DRAM) with a partial refresh function that refreshes only a desired part of the DRAM, have been proposed.

A power-down mode in which a memory device in an active/standby state operates to reduce power consumption has been proposed in the Joint Electronic Device Engineering Council (JEDEC). Also, the standard for a deep power-down mode (hereinafter referred to as "DPD mode") in which power consumption is minimized by not operating an internal voltage generator in a memory device when the memory device is not used, is specified in the JEDEC.

FIG. 1 is a timing diagram of the DPD mode specified in the JEDEC. Referring to FIG. 1, a memory device enters the DPD mode in synchronization with a clock signal CLK when a clock enable signal CKE, a write enable signal /WE, and a selection signal /CS are at a logic low level and a row address strobe signal /RAS and a column address strobe signal /CAS are at a logic high level; and exits the DPD mode when the clock enable signal CKE is at a logic high level.

After exiting the DPD mode, the memory device normally operates after a predetermined period of time, e.g., a power-up sequence of 200 us. During the DPD mode, all internal voltage generators in the memory device are disabled, that is, they do not operate, thereby reducing power consumption.

Although, power consumption is low in the DPD mode illustrated in FIG. 1, data stored in memory cells of the memory device is not retained. This is because the internal voltage generators do not operate, and thus, a refresh operation cannot be performed. Therefore, in a conventional memory device, to retain the data, during the DPD mode, before entering the DPD mode, data stored in the memory device must be moved to another storage location.

SUMMARY OF THE INVENTION

An embodiment includes a memory device including a bit line sense amplifier, a command decoder configured to generate an internal control signal indicating an operating mode of the memory device, and a bit line sense amplifier controller configured to selectively apply an external voltage as a supply voltage to the bit line sense amplifier in response to the internal control signal.

Another embodiment includes a method of operating a memory device including determining whether the memory device is in a deep power-down mode, if the memory device is not in the deep power-down mode, driving a bit line sense amplifier using an internal voltage, and if the memory device is in the deep power-down mode, driving the bit line sense amplifier using an external voltage.

A further embodiment includes a method of operating a memory device including applying a command to enter a deep power-down mode, and switching a supply voltage for a bit line sense amplifier from an internal voltage to an external voltage in response to the command to enter the deep power-down mode.

BRIEF DESCRIPTION OF THE DRAWINGS

The above and other aspects and advantages will become more apparent by describing embodiments in detail with reference to the attached drawings in which.

DETAILED DESCRIPTION OF THE INVENTION

Figure 1:
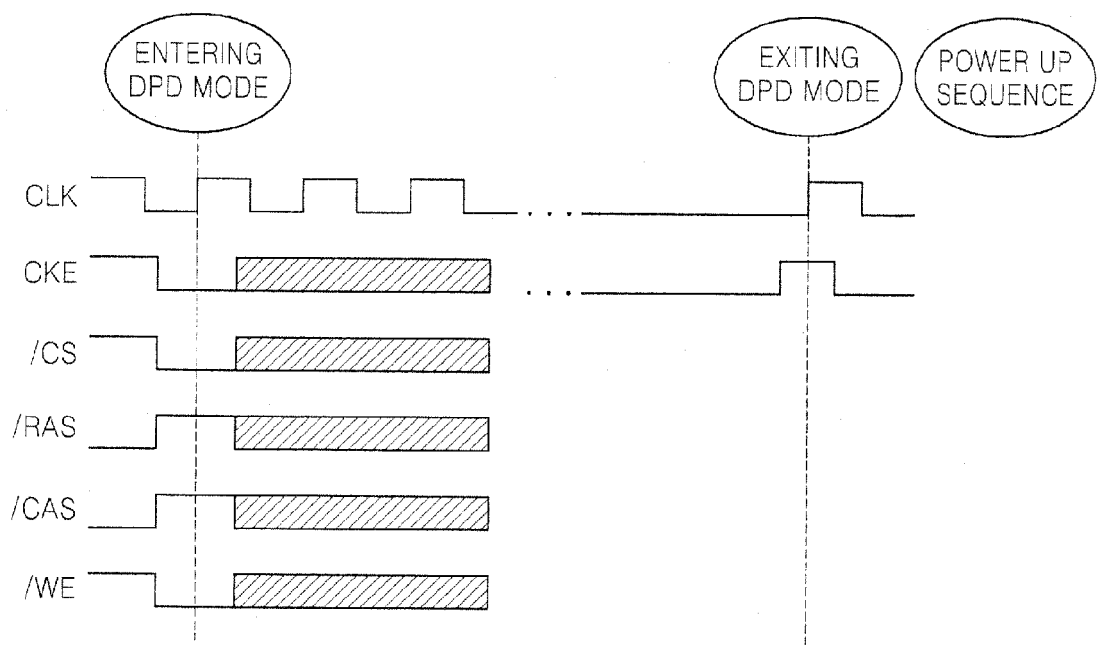
FIG. 1 is a timing diagram of a deep power-down (DPD) mode specified by the Joint Electronic Device Engineering Council (JEDEC)

Hereinafter, embodiments will be described in detail with reference to the accompanying drawings. Like reference numerals designate like elements throughout the specification.

Figure 2:
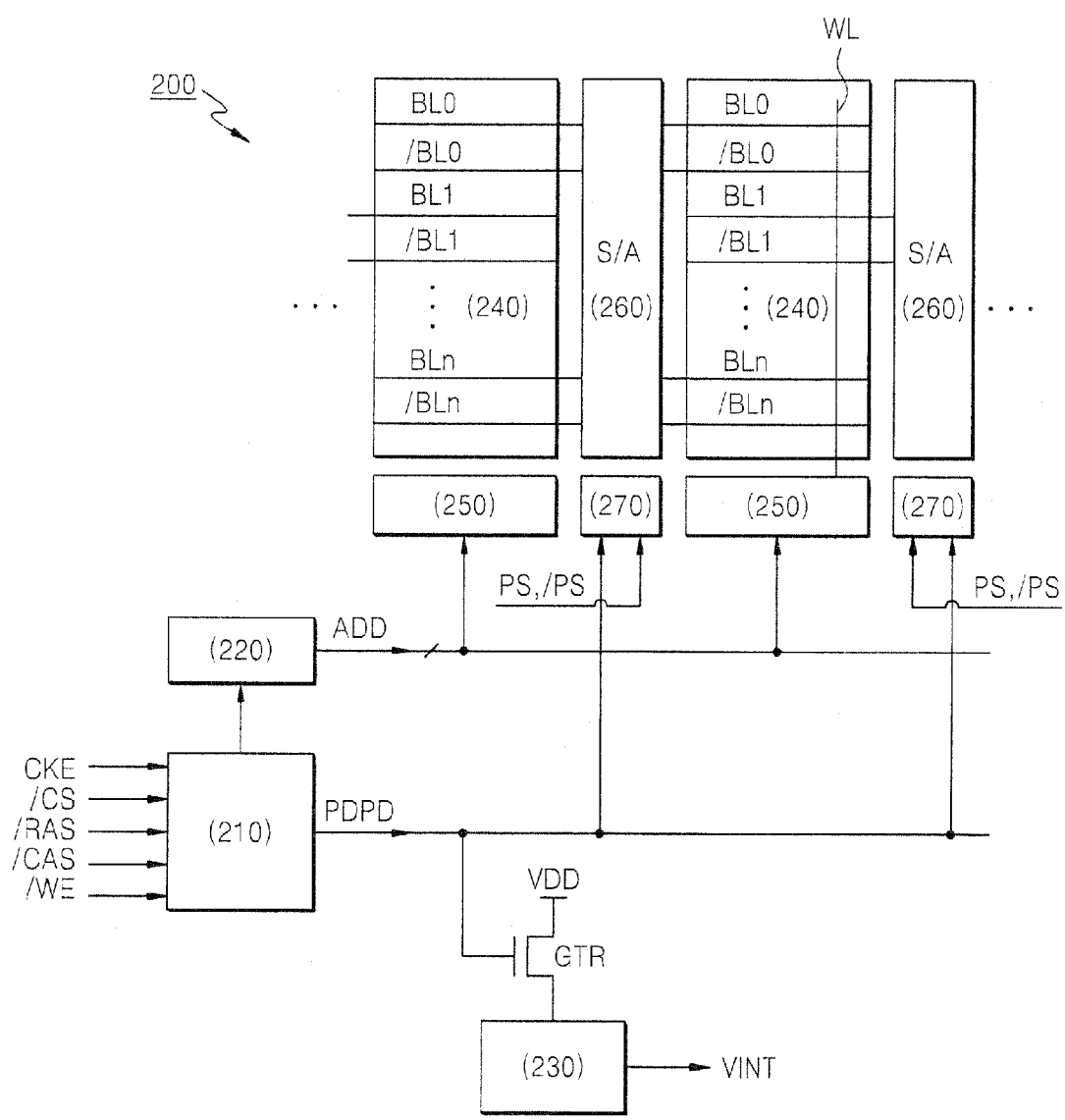
FIG. 2 is a schematic block diagram of a memory device according to an embodiment.

FIG. 2 is a schematic block diagram of a memory device 200 according to an embodiment. The memory device 200 includes a command decoder 210 and bit line sense amplifier controllers 270.

The command decoder 210 generates an internal control signal PDPD that indicates an operating mode of the memory device 200 in response to external control signals CKE, /RAS, /CAS, /CS, and /WE.

Each bit line sense amplifier controller 270 selectively supplies one of an internal voltage VINT and an external voltage VDD as a supply voltage to an associated bit line sense amplifier 260, in response to the internal control signal PDPD. Each of the external control signals CKE, /RAS, /CAS, /CS, and /WE is a command signal that determines the operating mode of the memory device 200.

For convenience of explanation, FIG. 2 further illustrates an address controller 220, an internal voltage generator 230, memory blocks 240, and word line drivers 250.

The structures and operations of the address controller 220, the memory block 240, and the word line drivers 250 are obvious to those of ordinary skill in the art.

The command decoder 210 generates the internal control signal PDPD indicating the operating mode of the memory device 200, in response to the external control signals CKE, /RAS, /CAS, /CS, and /WE. For example, when the external control signals CKE, /RAS, /CAS, /CS, and /WE indicate a deep power-down (DPD) mode of the memory device 200, the command decoder 210 decodes the external control signals CKE, /RAS, /CAS, /CS, and /WE to generate the internal control signal PDPD at a logic high indicating the DPD mode.

However, it would be obvious to those of ordinary skill in the art that the internal control signal PDPD may be generated at a logic low level indicating the DPD mode according to the circuit construction.

The internal voltage generator 230 is turned on or off in response to the internal control signal PDPD. In detail, when the memory device 200 is not in the DPD mode, the internal voltage generator 230 generates the internal voltage VINT and a word line voltage required in the memory device 200, using the external voltage VDD. When the memory device 200 is in the DPD mode, a transistor GTR is turned off thereby turning off the internal voltage generator 230, in response to the internal control signal PDPD.

The bit line sense amplifier 260 is installed between the memory blocks 240. The bit line sense amplifier 260 may have a folded structure in which it is coupled to bit lines BL and inverted bit lines /BL of the memory block 240 to the right or left of the bit line sense amplifier 260.

Alternatively, the bit line sense amplifier 260 may have an open structure in which it is coupled to the bit lines BL of the memory block 240 to the left of the bit line sense amplifier 260 and the inverted bit lines /BL of the memory block 240 to the right of the bit line sense amplifier 260.

The bit line sense amplifier controller 270 controls an operation of the bit line sense amplifier 260 in response to a sensing enable signal PS, an inverted sensing enable signal /PS, and the internal control signal PDPD.

Figure 3:
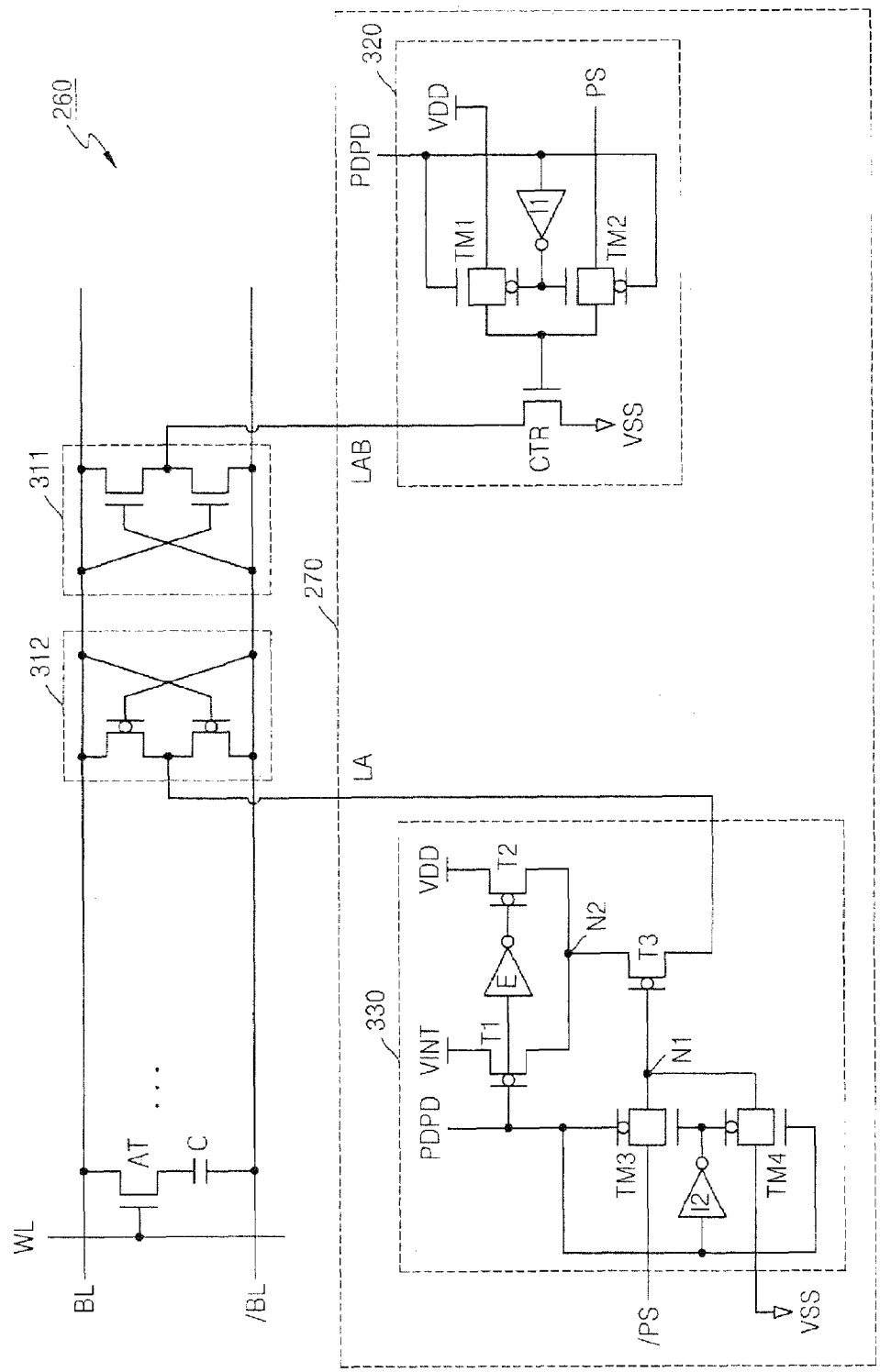
FIG. 3 is a circuit diagram illustrating a connection of a bit line sense amplifier to a bit line sense amplifier controller illustrated in FIG. 2, according to an embodiment.

FIG. 3 is a circuit diagram illustrating a connection of the bit line sense amplifier 260 to the bit line sense amplifier controller 270, illustrated in FIG. 2, according to an embodiment. Referring to FIG. 3, the bit line sense amplifier 260 includes a pair of NMOS transistors 311 and a pair of PMOS transistors 312. The transistors of each pair are cross-coupled to a bit line BL and an inverted bit line /BL. That is, the bit line sense amplifier 260 is a latch type, and thus, only a small amount of current is consumed as a leakage current flowing through the bit line sense amplifier 260.

The bit line sense amplifier controller 270 applies the external voltage VDD as a supply voltage to the bit line sense amplifier 260, in response to the internal control signal PDPD generated from the external control signals CKE, /RAS, /CAS, /CS, and /WE indicating the DPD mode of the memory device 200.

If the external control signals CKE, /RAS, /CAS, /CS, and /WE indicate an operation that is not in the DPD mode, the bit line sense amplifier controller 270 applies the internal voltage VINT as the supply voltage to the bit line sense amplifier 260 in response to the internal control signal PDPD.

The bit line sense amplifier controller 270 includes an NMOS controller 320 and a PMOS controller 330.

In response to the internal control signal PDPD, the NMOS controller 320 controls a corresponding pair of the NMOS transistors 311 of the bit line sense amplifier 260 by using the external voltage VDD in the DPD mode and by using a sensing enable signal PS when not in the DPD mode.

In response to the internal control signal PDPD, the PMOS controller 330 controls a corresponding pair of the PMOS transistors 312 of the bit line sense amplifier 260 by using the external voltage VDD in the DPD mode and by using an inverted sensing enable signal /PS and the internal voltage VINT when not in the DPD mode.

The NMOS controller 320 includes first and second transmission gates TM1 and TM2 and a control transistor CTR.

The first transmission gate TM1 connects the external voltage VDD to or disconnects the external voltage VDD from the control transistor CTR, in response to the internal control signal PDPD. The second transmission gate TM2 transmits or blocks the sensing enable signal PS in response to the internal control signal PDPD.

When the external voltage VDD or the sensing enable signal PS output from the first and second transmission gates TM1 and TM2 is input to a gate of the control transistor CTR, the control transistor CTR generates an NMOS transistor pair sensing signal LAB having a ground voltage VSS that controls the corresponding pair of the NMOS transistors 311 of the bit line sense amplifier 260.

The PMOS controller 330 includes third and fourth transmission gates TM3 and TM4, and first through third transistors T1, T2, and T3.

The third transmission gate TM3 transmits to a first node N1 or blocks the inverted sensing enable signal /PS in response to the internal control signal PDPD. The fourth transmission gate TM4 connects the first node N1 to a ground voltage VSS or disconnects it from the ground voltage VSS in response to the internal control signal PDPD.

The first transistor T1 is coupled between the internal voltage VINT and a second node N2, and the internal control signal PDPD is input to a gate of the first transistor T1. The second transistor T2 is coupled between the external voltage VDD and the second node N2, and an inverted signal of the internal control signal PDPD is input to a gate of the second transistor T2. The PMOS controller 330 may include an inverter E that inverts the internal control signal PDPD.

A first terminal and gate of the third transistor T3 are coupled to the second node N2 and the first node N1, respectively. A PMOS transistor pair sensing signal LA that controls the corresponding pair of the PMOS transistors 312 of the bit line sense amplifier 260, is output from the second terminal of the third transistor T3.

The NMOS controller 320 generates the NMOS transistor pair sensing signal LAB that controls the pair of the NMOS transistors 311 of the bit line sense amplifier 260, in response to the sensing enable signal PS and the internal control signal PDPD.

When the memory device 200 is not in the DPD mode, i.e., when the internal control signal PDPD is at a logic low, the first transmission gate TM1 is turned off and the second transmission gate TM2 is turned on to supply the sensing enable signal PS to the gate of the control transistor CTR. Accordingly, the control transistor CTR is turned on or off in response to the sensing enable signal PS and the NMOS transistor pair sensing signal LAB having a ground voltage VSS is selectively applied to the corresponding pair of the NMOS transistors 311.

When the memory device 200 is in the DPD mode, that is, when the internal control signal PDPD is at a logic high level, the first transmission gate TM1 is turned on and the second transmission gate TM2 is turned off to apply the external voltage VDD to the gate of the control transistor CTR. Thus, the control transistor CTR is turned on in response to the external voltage VDD, and the NMOS transistor pair sensing signal LAB having a ground voltage VSS is supplied to the corresponding pair of the NMOS transistors 311. The NMOS controller 320 may further include an inverter 11 that controls the first and second transmission gates TM1 and TM2.

The PMOS controller 330 generates the PMOS transistor pair sensing signal LA that controls the pair of the PMOS transistors 312 of the bit line sense amplifier 260, in response to the inverted sensing enable signal /PS and the internal control signal PDPD.

When the memory device 200 is not in the DPD mode, that is, when the internal control signal PDPD is at a logic low level, the first transistor T1 is turned on to apply the internal voltage VINT to a source of the third transistor T3 and the third transmission gate TM3 is turned on to apply the inverted sensing enable signal /PS to the gate of the third transistor T3.

Thus, the third transistor T3 is turned on or off in response to the inverted sensing enable signal /PS to supply the PMOS transistor pair sensing signal LA having an internal voltage VINT to the corresponding pair of the PMOS transistors 312.

When the memory device 200 is in the DPD mode, that is, when the internal control signal PDPD is at a logic high level, the first transistor T1 is turned off and the second transistor T2 is turned on to apply the external voltage VDD to the source of the third transistor T3, i.e., the second node N2, and the third transmission gate TM3 is turned off and the fourth transmission gate TM4 is turned on to apply the ground voltage VSS to the gate of the third transistor T3. Thus, the third transistor T3 is turned on to supply the external voltage VDD as the PMOS transistor pair sensing signal LA to the corresponding pair of the PMOS transistors 312.

In addition, the bit line sense amplifier controller 270 may further include a precharge controller (not shown) that precharges the PMOS transistor pair sensing signal LA and the NMOS transistor pair sensing signal LAB to a predetermined voltage in a precharge state.

Accordingly, if the memory device 200 is in the DPD mode, the bit line sense amplifier 260 is driven by the external voltage VDD to retain data required.

Figure 4:
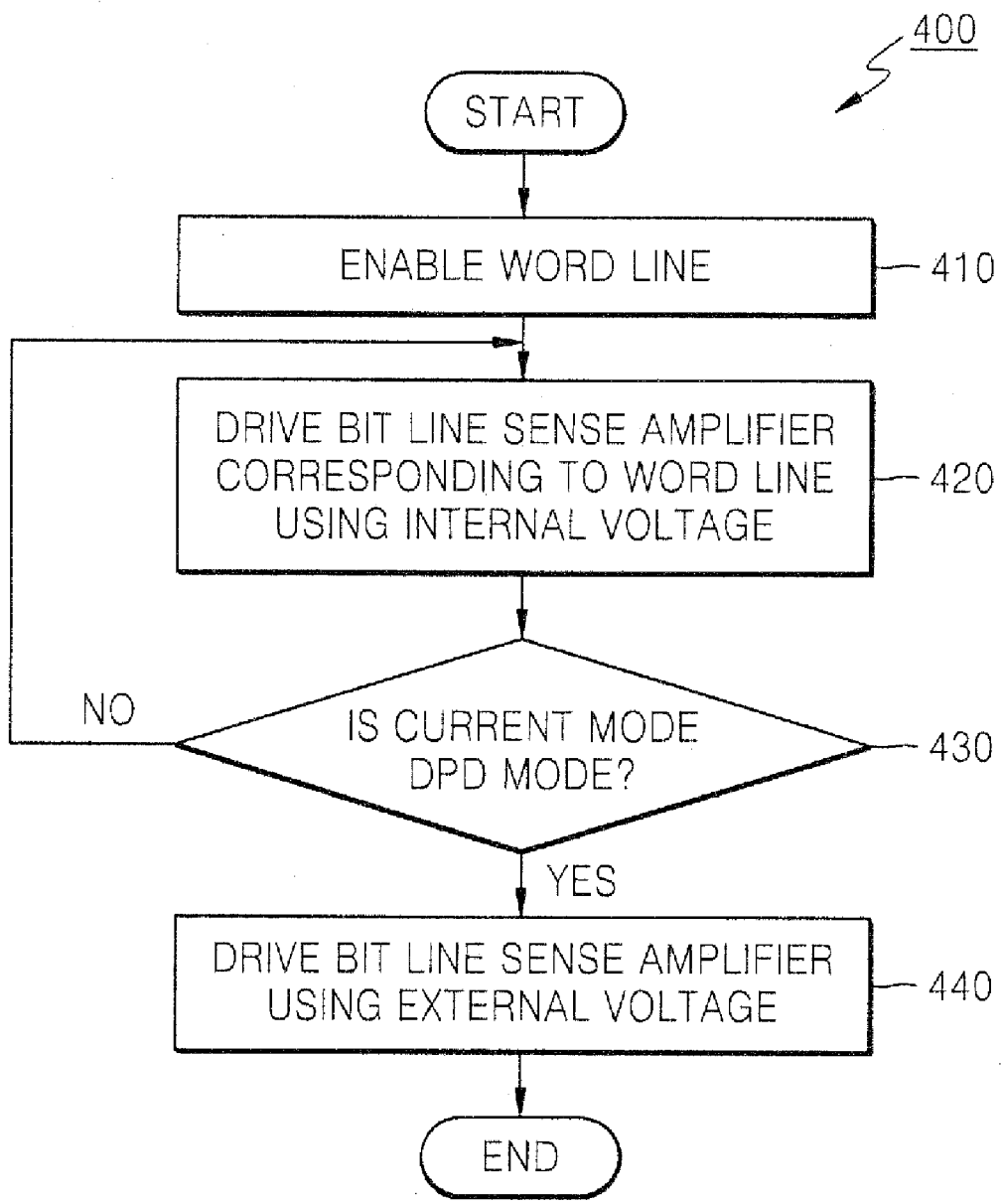
FIG. 4 is a flowchart illustrating a method of operating a memory device according to an embodiment.

FIG. 4 is a flowchart illustrating a method 400 of operating a memory device according to an embodiment. Referring to FIG. 4, according to the method 400, first, a word line is enabled in 410, and then, a bit line sense amplifier corresponding to the word line is driven by an internal voltage in 420.

Next, it is determined whether a current mode of a memory device is a DPD mode in 430. When the current mode is the DPD mode, an internal voltage generator that generates the internal voltage is disabled and a bit line sense amplifier is driven by an external voltage in 440.

When the current mode is not in the DPD mode, the bit line sense amplifier is driven by the internal voltage in 420.

Figure 5:
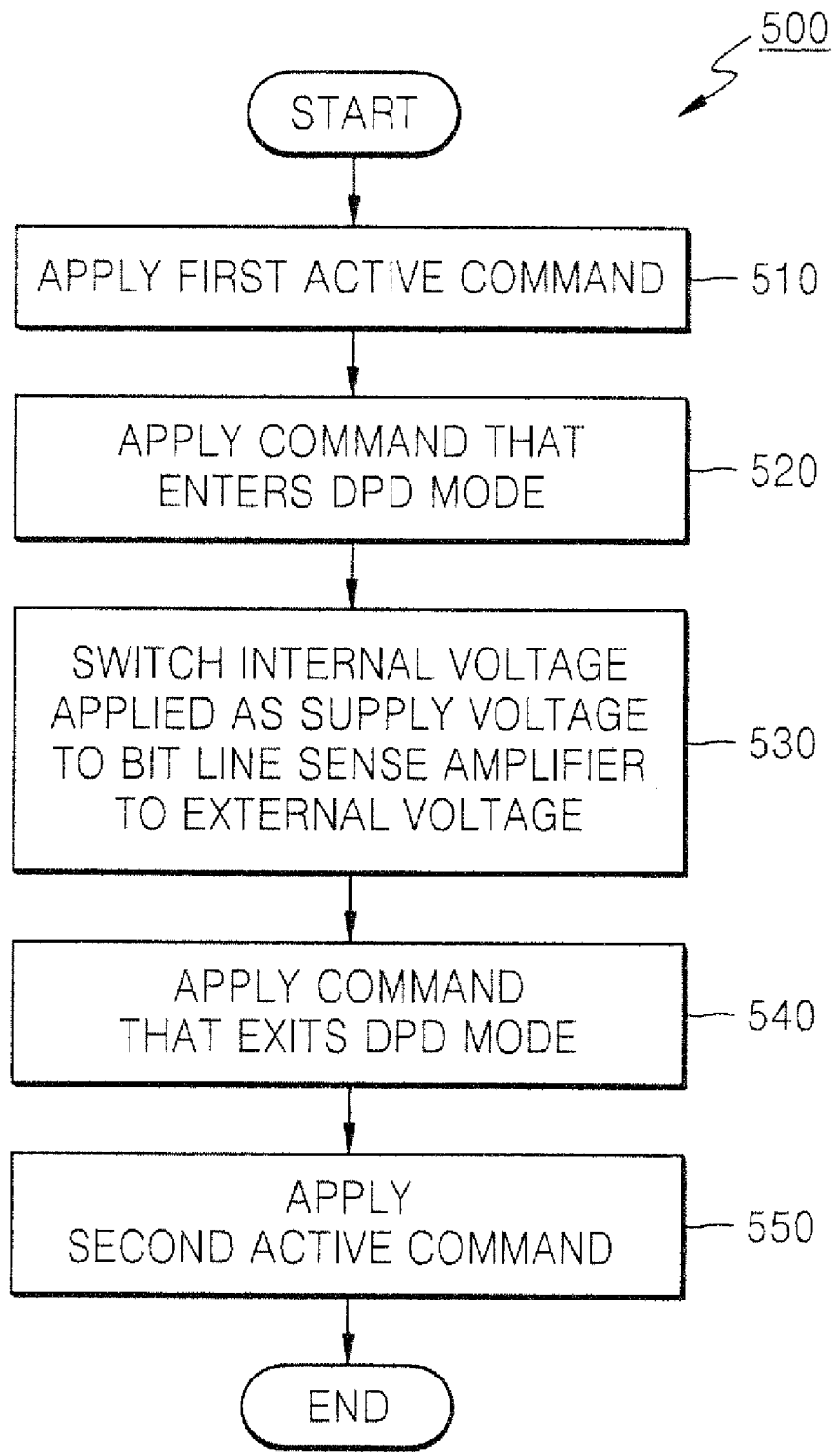
FIG. 5 is a flowchart illustrating a method of operating a memory device according to another embodiment.
Figure 6A:
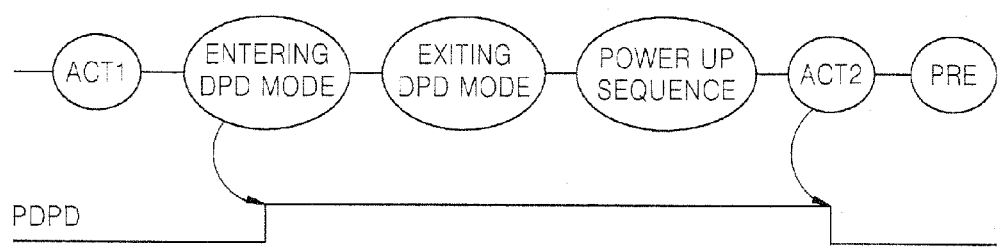
FIG. 6A is a timing diagram illustrating entry and exit stages of the DPD mode according to the method of FIG. 5, according to an embodiment.
Figure 6B:
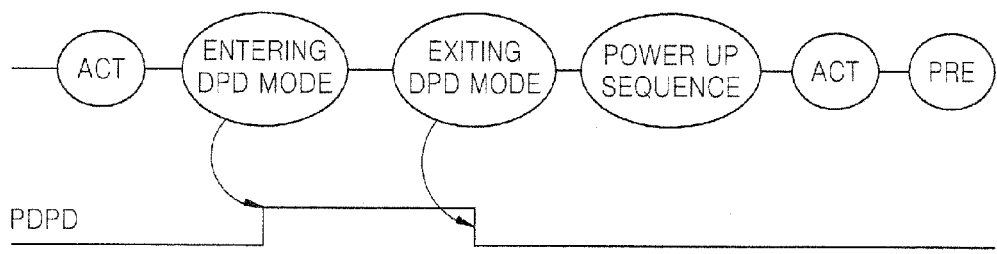
FIG. 6B is a timing diagram illustrating entry and exit stages of the DPD mode according to a conventional method.

FIG. 5 is a flowchart illustrating a method 500 of operating a memory device according to another embodiment. FIG. 6A is a timing diagram illustrating entry and exit stages of the DPD mode according to the method 500. FIG. 6B is a timing diagram illustrating entry and exit stages of the DPD mode according to a conventional method.

According to the method 500, initially, a first active command that enables a word line and operates a bit line sense amplifier coupled to the word line using an internal voltage, is applied in 510. Next, a command that enters the DPD mode is applied in 520. Next, the internal voltage applied as a supply voltage to the bit line sense amplifier is switched to an external voltage in response to the command that enters the DPD mode in 530. Next, a command that exits the DPD mode is applied in 540. Thereafter, a second active command that enables the word line again, is applied in 550.

The method 500 will now be described with reference to FIGS. 2, 3, 5, 6A, and 6B. In a normal mode of the memory device 200, the internal control signal PDPD is at a logic low level. In response to the internal control signal PDPD, the first and second transmission gates TM1 and TM2 of the NMOS controller 320 are respectively turned off and on to supply the sensing enable signal PS at a logic high level to the gate of the control transistor CTR.

Then, the third and fourth transmission gates TM3 and TM4 of the PMOS controller 330 are respectively turned on and off to supply the inverted sensing enable signal /PS to the gate of the third transistor T3. Also, the first and second transistors T1 and T2 of the PMOS controller 330 are respectively turned on and off to apply the internal voltage VINT to the source of the third transistor T3.

When a first active command ACT1 is input to the memory device 200 in 510, a specific word line WL of a corresponding memory block of the memory blocks 240 is enabled by internal circuits of the address controller 220 and the word line driver 250. When the specific word line WL is enabled, charges in a cell capacitor C are applied to the pair of bit lines BL and /BL via an access transistor AT The sensing enable signal PS at a logic high level and the inverted sensing enable signal /PS at a logic low level are generated a predetermined time after the word line WL is activated.

The sensing enable signal PS at the logic high level is applied to the gate of the control transistor CTR via the second transmission gate TM2 of the NMOS controller 320. Then, a voltage of the NMOS transistor pair sensing signal LAB becomes equal to the ground voltage VSS, and the pair of the NMOS transistors 311 of the bit line sense amplifier 260 operate to sense and amplify one of the bit line BL and the inverted bit line /BL to the ground voltage VSS.

The inverted sensing enable signal /PS at the logic low level is applied to the gate of the third transistor T3 via the third transmission gate TM3 of the PMOS controller 330. Then, a voltage of the PMOS transistor pair sensing signal LA becomes equal to the internal voltage VINT via the turned-on third transistor T3, and the pair of the PMOS transistors 312 of the bit line sense amplifier 260 operate to amplify the other of the bit line BL and the inverted bit line /BL to the internal voltage VINT.

In other words, the bit line sense amplifier 260 amplifies and latches data in a memory coupled to the word line WL enabled by the first active command ACT1 to the internal voltage VINT or the ground voltage VSS at the bit line BL or the inverted bit line /BL.

The first active command ACT1 may be repeatedly applied to enable word lines of each memory block 240 that do not share the bit line sense amplifier 260.

After sensing and amplifying operations of the bit line sense amplifier 260 in response to the first active command ACT1, a command that enters the DPD mode is applied through the external control signals CKE, /RAS, /CAS, /CS, and /WE, for example, in 520. The command decoder 210 decodes the external control signals CKE, /RAS, /CAS, /CS, and /WE to generate the internal control signal PDPD at a logic high level.

When the internal control signal PDPD transitions to a logic high level, the internal voltage generator 230 does not operate and operations of circuits that use the internal voltage VINT in the memory device 200 are stopped. That is, in the DPD mode, the internal voltage generator 230 is disabled, minimizing power consumption.

In response to the internal control signal PDPD at the logic high level, the first and second transmission gates TM1 and TM2 of the NMOS controller 320 are respectively turned on and off to apply the external voltage VDD to the gate of the control transistor CTR. Then, the NMOS transistor pair sensing signal LAB is maintained at the ground voltage VSS, and the pair of the NMOS transistors 311 of the bit line sense amplifier 260 maintain one of the bit line BL and the inverted bit line /BL at the ground voltage VSS.

In response to the internal control signal PDPD at the logic high level, the first and second transistors T1 and T2 of the PMOS controller 330 are respectively turned off and on to apply the external voltage VDD to the source of the third transistor T3. In addition, the third and fourth transmission gates TM3 and TM4 are respectively turned off and on to apply the ground voltage VSS to the gate of the third transistor T3.

Accordingly, the PMOS transistor pair sensing signal LA is coupled to the external voltage VDD, and the pair of the PMOS transistors 312 of the bit line sense amplifier 260 maintain the other of the bit line BL and the inverted bit line /BL at the external voltage VDD in 530.

In other words, in the DPD mode, the supply voltage applied to the bit line sense amplifier 260 is switched from the internal voltage VINT to the external voltage VDD. Therefore, even if the internal voltage generator 230 does not operate, it is possible to retain data by continuously operating the bit line sense amplifier 260 using the external voltage VDD and the ground voltage VSS. Thus, data can be retained without a refresh operation in the DPD mode.

When a clock signal CKE transitions to a logic high level, the memory device 200 exits the DPD mode in 540, and a power-up sequence is performed for a predetermined time. During the power-up sequence, the internal voltage generator 230 is enabled to generate the internal voltage VINT from the external voltage VDD. The generated internal voltage VINT is applied as a supply voltage to an internal circuit such as the bit line sense amplifier controller 270 of the memory device 200.

Next, a second active command ACT2 that enables the word line that was enabled in 510 is applied in 550. If the first active command ACT1 was applied a predetermined number of times, the second active command ACT2 may also be applied the predetermined number of times.

In response to the second active command ACT2, the word line is activated again to generate a sensing enable signal PS at a logic high level and an inverted sensing enable signal /PS at a logic low level.

When the sensing enable signal PS and the inverted sensing enable signal /PS transitions to a logic high level and a logic low level, respectively, the internal control signal PDPD transitions to a logic low level to indicate that the memory has exited the DPD mode.

Referring to FIG. 6B, according to the conventional method, the internal control signal PDPD transitions to a logic high level simultaneously when entering the DPD mode, and transitions to a logic low level simultaneously when exiting the DPD mode. In contrast, according to an embodiment, even after exiting the DPD mode, the internal control signal PDPD does not transit to a logic low level until the second active command ACT2 is generated, thereby guaranteeing the following operations of the memory device 200.

Until the word line is activated, that is, the second active command ACT2 is applied, a sensing enable signal PS and an inverted sensing enable signal /PS have not been generated at a logic high level and at a logic low level, respectively. According to an embodiment, the internal control signal PDPD is maintained at a logic high level until the word line is activated (until the second active command ACT2 is applied). Therefore, the external voltage VDD is used as the supply voltage to the bit line sense amplifier 260.

Next, when the second active command ACT2 is applied, a sensing enable signal PS and an inverted sensing enable signal /PS are generated at a logic high level and at a logic low level, respectively. The internal control signal PDPD transitions to a logic low level. As a result, the internal voltage VINT is applied as the supply voltage to the bit line sense amplifier 260. Thus, the supply voltage to the bit line sense amplifier 260 is switched from the external voltage VDD to the internal voltage VINT, and data stored in the bit line sense amplifier 260 is written to memory cells coupled to the enabled word line.

After the data stored in the bit line sense amplifier 260 is written to the memory cells in response to the second active command ACT2, a precharge command that disables the enabled word line may be applied.

Embodiments have been described regarding retaining of multiple pieces of data coupled to a word line. However, the number of word lines to be enabled may be changed according to the amount of data to be retained during the DPD mode.

While the embodiments have been particularly shown and described with reference to the drawings, it will be understood by those skilled in the art that various changes in form and details may be made therein without departing from the spirit and scope as defined by the appended claims.

What is claimed is:

1. A memory device comprising:
    a bit line sense amplifier;
    a command decoder configured to generate an internal control signal indicating an operating mode of the memory device; and
    a bit line sense amplifier controller configured to selectively apply an external voltage as a supply voltage to the bit line sense amplifier in response to the internal control signal.

2. The memory device of claim 1, wherein the command decoder is configured to generate the internal control signal in response to external control signals.

3. The memory device of claim 2, wherein the external control signals comprise command signals for determining an operating mode of the memory device.

4. The memory device of claim 1, wherein the bit line sense amplifier controller is further configured to apply the external voltage as the supply voltage to the bit line sense amplifier when the internal control signal indicates that the memory device is in the deep power-down mode.

5. The memory device of claim 1, wherein the bit line sense amplifier controller is further configured to selectively apply one of an internal voltage and the external voltage as the supply voltage to the bit line sense amplifier in response to the internal control signal.

6. The memory device of claim 5, wherein the bit line sense amplifier controller is further configured to apply the internal voltage as the supply voltage for the bit line sense amplifier when the internal control signal indicates that the memory device is not in the deep power-down mode.

7. The memory device of claim 5, wherein the bit line sense amplifier controller comprises:
    an NMOS controller configured to selectively couple a corresponding pair of NMOS transistors of the bit line sense amplifier to a ground in response to the internal control signal and a sensing enable signal; and
    a PMOS controller configured to selectively couple the supply voltage to a corresponding pair of PMOS transistors of the bit line sense amplifier in response to the internal control signal and the sensing enable signal, and to select the one of the internal voltage and the external voltage as the supply voltage in response to the internal control signal.

8. The memory device of claim 7, wherein:
the NMOS controller is further configured to couple the corresponding pair of NMOS transistors to the ground if the internal signal indicates that the memory device is in the deep power-down mode, and to selectively couple the corresponding pair of NMOS transistors to the ground in response to the sensing enable signal if the internal signal indicates that the memory device is not in the deep power-down mode; and
the PMOS controller is further configured to coupled the corresponding pair of PMOS transistors to the external voltage if the internal signal indicates that the memory device is in the deep power-down mode, and to selectively couple the corresponding pair of NMOS transistors to the internal voltage in response to the sensing enable signal if the internal signal indicates that the memory device is not in the deep power-down mode.

9. The memory device of claim 7, wherein the NMOS controller comprises:
a control transistor coupled to a ground;
a first transmission gate coupled to the control transistor and configured to selectively transmit the external voltage to the control transistor in response to the internal control signal; and
a second transmission gate coupled to the control transistor and configured to selectively transmit the sensing enable signal to the control transistor in response to the internal control signal.

10. The memory device of claim 7, wherein the PMOS controller comprises:
a first transistor configured to provide a voltage on a first node as the PMOS transistor pair sensing signal to the PMOS transistors of the bit line sense amplifier in response to a signal on a second node;
a first transmission gate configured to transmit the inverted sensing enable signal to the second node when the memory device is not in the deep power-down mode;
a second transmission gate configured to transmit a ground voltage to the second node when the memory device is in the deep power-down mode;
a second transistor configured to provide the internal voltage to the first node when the memory device is not in the deep power-down mode; and
a third transistor configured to provide the external voltage to the first node when the memory device is in the deep power-down mode.

11. The memory device of claim 5, further comprising an internal voltage generator configured to generate the internal voltage from the external voltage in response to the internal control signal, wherein the internal voltage does not generate the internal voltage when the internal control signal indicates that the memory device is in the deep power-down mode.

12. A memory device comprising:
a bit line sense amplifier; and
a bit line sense amplifier controller applying an external voltage as a voltage for driving the bit line sense amplifier in response to an internal control signal when the memory device is in a deep power-down mode.

13. The memory device of claim 12, wherein the bit line sense amplifier controller applies an internal voltage as a voltage for driving the bit line sense amplifier in response to the internal control signal when the memory device is not in the deep power-down mode.

14. The memory device of claim 12, further comprising a command decoder generating the internal control signal in response to external control signals,
wherein the external control signals contain commands that indicate the deep power-down mode of the memory device.

15. The memory device of claim 12, further comprising an internal voltage generator generating the internal voltage in response to the external voltage, the internal voltage generator stopping generation of the internal voltage in response to the internal control signal in the deep power-down mode.

* * * * *

UNITED STATES PATENT AND TRADEMARK OFFICE
CERTIFICATE OF CORRECTION

PATENT NO.         : 7,492,654 B2                                        Page 1 of 1
APPLICATION NO. : 11/423673
DATED                : February 17, 2009
INVENTOR(S)       : Myung-Gyoo Won et al.

It is certified that error appears in the above-identified patent and that said Letters Patent is hereby corrected as shown below:

Column 5, line 2, the word "11" should read -- I1 --.

Signed and Sealed this

Twenty-fourth Day of November, 2009

David J. Kappos
*Director of the United States Patent and Trademark Office*